(12) United States Patent
Yamazaki

(10) Patent No.: US 7,112,556 B1
(45) Date of Patent: Sep. 26, 2006

(54) SUPERCONDUCTING CERAMICS

(75) Inventor: Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 08/065,757

(22) Filed: May 24, 1993

Related U.S. Application Data

(63) Continuation of application No. 07/120,144, filed on Nov. 13, 1987, now abandoned.

(30) Foreign Application Priority Data

| Mar. 25, 1987 | (JP) | ................................... 62-72481 |
| Mar. 25, 1987 | (JP) | ................................... 62-72483 |
| Mar. 25, 1987 | (JP) | ................................... 62-72487 |

(51) Int. Cl.
*C04B 35/45* (2006.01)

(52) U.S. Cl. ..................... 505/126; 505/125; 505/779; 505/780

(58) Field of Classification Search .................... 505/1, 505/778, 779, 780; 252/518, 521; 501/152, 501/153
See application file for complete search history.

(56) References Cited

U.S. PATENT DOCUMENTS

| 2,976,505 | A | * | 3/1961 | Ichikowa .................... 501/152 |
| 3,351,568 | A | * | 11/1967 | Waseleski et al. .......... 501/152 |
| 3,441,517 | A | * | 4/1969 | Braver et al. ............... 501/152 |
| 4,045,375 | A | * | 8/1977 | Komatu ..................... 501/152 |
| 4,054,532 | A | * | 10/1977 | Hanke et al. ............... 501/152 |
| 4,797,510 | A | | 1/1989 | Mihelich |
| 4,826,808 | A | | 5/1989 | Yurek et al. |
| 4,900,715 | A | | 2/1990 | Cooper et al. |
| 4,916,116 | A | | 4/1990 | Yamazaki |
| 4,959,345 | A | | 9/1990 | Yamazaki |
| 4,971,667 | A | | 11/1990 | Yamazaki et al. |
| 4,996,185 | A | | 2/1991 | Fujimori et al. |
| 5,036,043 | A | | 7/1991 | Subramanian |
| 5,108,986 | A | * | 4/1992 | Kohno et al. ............... 505/780 |
| 5,140,000 | A | * | 8/1992 | Tallon et al. ............... 505/780 |
| 5,217,945 | A | * | 6/1993 | Wada et al. ................ 505/780 |
| 6,506,709 | B1 | | 1/2003 | Yamazaki |
| 6,630,425 | B1 | * | 10/2003 | Batlogg et al. ............. 505/126 |
| 6,635,603 | B1 | * | 10/2003 | Batlogg et al. ............. 505/126 |
| 6,638,894 | B1 | * | 10/2003 | Batlogg et al. ............. 505/126 |

FOREIGN PATENT DOCUMENTS

| AU | B-10014/88 | 8/1988 |
| AU | B-12783/88 | 9/1988 |
| EP | 0274407 | 7/1988 |
| EP | 0274421 | 7/1988 |
| EP | 0282360 | 9/1988 |
| JP | 63-225531 | 9/1988 |
| JP | 63-225572 | 9/1988 |
| JP | 63-230563 | 9/1988 |

(Continued)

OTHER PUBLICATIONS

Saito, et al; "Properties of the Superconductor (Sr, Ca)-La-Cu-o System in Various Sintering Atmosphere"; Japan J of Applied Physics, vol. 26, No. 4, Apr. 1987, pp. 366-367.*

(Continued)

*Primary Examiner*—C. Melissa Koslow
(74) *Attorney, Agent, or Firm*—Nixon Peabody LLP; Jeffrey L. Costellia

(57) ABSTRACT

Superconducting ceramics having relatively high critical temperatures are composed of rare earth metals, alkaline earth metals and copper. They have few defects and a limited polycrystalline interfacial area.

8 Claims, 1 Drawing Sheet

$(YBa_2)Cu_3O_{7-x}$

FOREIGN PATENT DOCUMENTS

| | | |
|---|---|---|
| JP | 63-233063 | 9/1988 |
| JP | 63-233064 | 9/1988 |
| JP | 63-236712 | 10/1988 |
| WO | 88-7264 | 9/1988 |

OTHER PUBLICATIONS

Uwe, et al; "Effect of Hetero-Valent Ion Doping in the High Tc Y-Ba-Cu-O Super-Conductor"; Japan J. Applied Physics, vol. 26, No. 5, May 1987, pp. 860-862.*

Veal, et al; "Superconductivity in $YBa_{2-x} Sr_x Cu_3 O_{7-\delta}$" Submitted to Applied Physics Letters May 6, 1987.*

Derwent abstract for DE 2,125,855 Apr. 24, 1974.*

Derwent abstact for JP 2005166816 Jun. 23, 2005.*

Z. Phys. B-Condensed Matter 66. 141-146 (1987) "Superconductivity at 40 K in La1.8Sr0.2CuO4" C. Politis and J. Geerk, M. Dietrick and B. Obst.

Physical Review Letters, vol. 58, No. 9 Mar. 2, 1987 "Superconductivity at 93 K in a New Mixed-Phase Y-Ba-Cu-O Compound System at Ambient Pressure" M.K. Wu, J.R. Ashburn, C.J. Torng, P.H. Hor, R.L. Meng, L. Gao, Z.J. Huang, Y.Q. Wang and C.W. Chu.

Er-Rakho et al., "A Series of Oxygen-Defect Perovskites Containing $Cu^{II}$ and $Cu^{III}$ the Oxides $La_{3-x}Ln_2Ba_3[Cu_{5-2y}^{II} Cu_{1+2y}^{III}]O_{14+y}$", pp. 151-156, 1981, Journal of Solid State Chemistry 37.

Engler et al., "Superconductivity Above Liquid Nitrogen Temperature: Preparation and Properties of a Family of Perovskite-Based Superconductors", pp. 2848-2849, 1987, J. Am. Chem. Soc., 109.

Shaplygin et al., "Preparation and Properties of the Compounds Ln2CuO4 (Ln=La, Pr, Nd, Sm, Eu, Gd) and Some of their Solid Solutions", pp. 820-824, 1979, Russian Journal of Inorganic Chemistry, 24(6).

Politts et al., "Superconductivity at 40L in . . . ", pp. 141-144, 1987, Condensed Matter, 66.

Engler et al., "Processing, Structure, and High-Tepmerature Superconductivity", pp. 266-271, 1987, Chemistry of High-Temperature Superconductors, ACS Symposium Series, 351.

Tarascon et al., "Oxygen and Rare-Earth Doping of the 90-K Superconducting Perovskite YBa2Cu3O7-x", pp. 226-234, Jul. 1, 1987, Physical Review B, 36(1).

Hor et al., "High-Pressure Study of the New Y-Ba-Cu-O Superconducting Compound System", pp. 911-912, Mar. 2, 1987, Physical Review Leters, vol. 58, No. 9.

Jorgansen et al., "Lattice Instability and High-Tc Superconductivity in La . . . ", pp. 1024-1027, Mar. 9, 1987, Physical Review Letters, vol. 58, No. 10.

Mattheiss, "Band properties and Superconductivity in . . . ", pp. 1028-1030, Mar. 9, 1987, Physical Review Letters, vol. 58, No. 10.

Chu et al., "Evidence for Superconductivity Above 40k in the La-Ba-Cu-O Compound System", pp. 405-407, Jan. 26, 1987, Physical Review Letters, vol. 58, No. 4.

Chu et al., "Superconductivity at 52.5 k in the Lanthanum-Barium-Copper-Oxide System", pp. 567-569, Jan. 30, 1987, Reports.

Bednorz et al., "Possible High Tc Superconductivity in the Baa-La-Cu-O System", pp. 189-193, 1986, Condensed Matter, 64.

Extended Abstracts of Annual Scholar Meeting (The 36th Spring Meeting, 1989) 2A-E-7/pp. 101.

Extended Abstracts of Annual Scholar Meeting (The 36th Spring Meeting, 1989) 2A-E-8/pp. 101.

Fisher, Superconductor Mysteries Unravel as Developments Proceed, Ceramic Bulletin, 1988, pp. 725-733, vol. 67, No. 4.

Beno et al., Structure of the single-phase high-temperature superconductor $YBa_2Cu_3O_{7-\delta}$, Appl. Phys. Lett., Jul. 6, 1987, pp. 57-59, vol. 51, No. 1.

Hatano et al., Superconducting and Transport Properties of B-Y-Cu-O Compounds-Orthorhombic and Tetragonal Phases, Japanese Journal of Applied Phys., May 1987, pp. L721-L723, vol. 26, No. 5.

Rao et al., High $T_c$ Superconductivity in Quasi Two-Dimensional Copper Oxides of $K_2NiF_4$ Structure, Current Science, Jan. 20, 1987, pp. 47-49, vol. 56, No. 2.

Nakamura et al., High $T_c$ Superconductivity Based on the Square Planar [CuO4]∞-Bonding System in $K_2NiF_4$,-Type $(A,A^*)_2CuO_4$ and Oxygen-Deficient Perovskite $(Ba_2A)Cu_3O_7$, Japanese Journal of Applied Physics, May 1987, pp. L678-L681, vol. 26, No. 5.

Kishio et al., Superconductivity Achieved at Over Liquid Nitrogen Temperature by (Mixed Rare Earths)-Ba-Cu Oxides, Japanese Journal of Applied Physics, May 1987, pp. L694-L696, vol. 26, No. 5.

Oota et al., Electrical, Magnetic and Superconducting Properties of the High-$T_c$.Superconductors $Er_{1-x} Yb_x Ba_2 Cu_3 O_{7-\delta}$, Japanese Journal of Applied Physics, Dec. 1987, pp. L2091-L2093, No. 12.

Ishida, Compositional Variation of High $T_c$ in $Yb_x Er_{1-x} Ba_2 Cu_3 O_{6+y}$ System, Japanese Journal of Applied Physics, Aug. 1987, pp. L1294-L1295, vol. 26, No. 8.

Ihara et al., Possibility of Superconductivity at 65° C in Sr-Ba-Y-Cu-O System, Japanese Journal of Applied Physics, Aug. 1987, pp. L1413-L1415, vol. 26, No. 8.

Takagi et al., High-$T_c$ Superconductivity of La-Ba-Cu Oxides. II.-Specification of the Superconducting Phase, Japanese Journal of Applied Physics, Feb. 1987, pp. L123-L124, vol. 26, No. 2.

Ohshima et al., Superconducting and Structural Properties of the New $Ba_{1-x}Ln_xCuO_{3-y}$ Compound System (Ln=La, Ce, Pr, Nd, Sm, Eu, Gd, Tb, Dy, Ho, Er and Yb), Japanese Journal of Applied Physics, May 1987, pp. L815-L817, vol. 26, No. 5.

Liang et al., The Effect of Substitution of La for Ba and Ce for Y on the $T_c$ of Superconducting $Ba_2YCu_3O_7$, Japanese Journal of Applied Physics, Jul. 1987, pp. L1150-L1152, vol. 26, No. 7.

Tamegai et al., Structures and Upper Critical Fields of High $T_c$ Superconductors $(RE)Ba_2Cu_3O_x$, Japanese Journal of Applied Physics, Aug. 1987, pp. L1304-L1306, vol. 26, No. 8.

Soderholm et al., Incorporation of Pr in $YBa_2Cu_3 O_{7-\delta}$,: electronic effects on superconductivity, Nature, Aug. 13, 1987, pp. 604-604, vol. 328.

Okai et al., Preperation and Physical Properties of $PrBa_2Cu_3O_y$, Japanese Journal of Applied Physics, Oct. 1987, pp. L1648-L1650, vol. 26, No. 10.

Jayaram et al., High Temperature Superconductivity in Y-Ba-Cu-O and Y-Ba-Sr-Cu-O Systems, Solid State Communications, 1987, pp. 713-716, vol. 63, No. 8.

Ono et al., Superconductivity in $Ba_{2(1-x)}Sr_{2x}YCu_3O_{7-y}$, Japanese Journal of Applied Physics, Oct. 1987, pp. L1687-L1689, vol. 26, No. 10.

Yoshida, Characteristics in Growth of the $YBa_2Cu_2O_x$ and $YBaSrCu_3O_x$ Crystalline Films, Japanese Journal of Applied Physics, Jul. 1988, pp. L1248-L1250, vol. 27, No. 7.

Hirabayashi et al., Structure and Superconductivity in New Type of Oxygen Deficient Perovskites $Y_1Ba_2Cu_3O_7$, Japanese Journal of Applied Physics, Apr. 1987, pp. L454-L455, vol. 26, No. 4.

Le-Page et al., "Room-Temperature Structure of the 90-K Bulk Superconductor $YBa_2Cu_3O_8$" pp. 7245-7248, May 1, 1987, Physical Review B, vol. 35, No. 13.

Chemistry Abstract, CA 109:161912, for BR 8, 702,554 (Nov. 1987).

* cited by examiner $(YBa_2)Cu_3O_{7-x}$

SUPERCONDUCTING CERAMICS

The application is a Continuation of Ser. No. 07/120,144, filed Nov. 13, 1987, now abandoned.

BACKGROUND OF THE INVENTION

This invention relates to superconducting ceramics having a high critical temperature.

The prior are has proposed the use of metals such as mercury and lead, intermetallics such as NbNd, $Nb_3Ge$ and $Nb_3Ga$ and ternary materials such as $Nb_3(Al_{0.8}Ge_{0.2})$ as superconductors. Another type of superconducting material, superconductive barium-lead-bismuth oxides, is described in U.S. Pat. No. 3,932,315. However, only three-dimensional electron conduction takes place in such conventional superconducting materials, and the critical transition temperature (Tc) of such conventional superconducting materials cannot therefore exceed 25° K.

In recent years, superconducting ceramics have attracted widespread interest. A new material was first reported by researchers at the Zurich laboratory of IBM Corp. as Ba—La—Cu—O-type high temperature superconducting oxides. Also, La—Sr—Cu(II)—O-type superconducting oxides have been proposed. This type of superconducting material appears to form a quasi-molecular crystalline structure whose unit cell is constructed with one layer in which electrons have essentially one-dimensional motion. Such a superconducting material, however, has Tc lower than 30° K.

OBJECTS AND SUMMARY OF THE INVENTION

The present invention seeks to provide superconducting ceramics having a higher Tc than hitherto, and having a few defects and a smaller interfacial area in its polycrystalline structure.

In accordance with the invention, there is provided a superconducting ceramic material which, in its broadest aspect, can be represented by the general formula $$(A_{1-x}B_x)_y Cu_z O_w \qquad (i)$$

in which $0.1 \leq x < 1$
  $y=2.0-4.0$
  $z=1.0-4.0$
  $w=4.0-10.0$
  A is one or more rare earth elements and B is more than one alkaline earth element when A is one rare earth element, and is one or more alkaline earth elements when A is more than one rare earth element.
  In general formula (i), preferably
  $y=2.5-3.5$
  $z=1.5-3.5$ and
  $w=6.0-8.0$.

The general formula (i) above embraces several sub-species of superconducting ceramic materials. One of these can be represented by the general formula $$0.5[(A_{1-x}B_x)_y Cu_z O_w (A_{1-x}B'_{x'})_{y'} Cu_{z'} O_{w'}] \qquad (ii)$$

in which $0.1 \leq <1$ $0.1 \leq x' < 1$
  $y=2.0-4.0$, preferably 2.5–3.5,
  $y'=2.0-4.0$, preferably 2.5–3.5,
  $z=1.0-4.0$, preferably 1.5–3.5,
  $z'=1.0-4.0$, preferably 1.5–3.5,
  $w=4.0-10.0$, preferably 6.0–8.0,
  $w'=4.0-10.0$, preferably 6.0–8.0,
  A is one rare earth element and each of B and B' is one or more alkaline earth elements.

Within the materials of general formula (ii), there are those in which A is one rare earth element exemplified by $YbBaSrCu_3O_{6-8}$, $YBaCaCu_3O_{6-8}$ and $YbBa_{0.7}Sr_{0.7}Ca_{0.6}Cu_3O_{6-8}$ and those in which A is more than one rare earth element exemplified by $Y_{0.5}Yb_{0.5}BaSrCu_3O_{6-8}$ and $Y_{0.5}Yb_{0.5}BaCaCu_3O_{6-8}$.

Another sub-species of superconducting ceramic materials of the general formula (i) can be presented by the general formula $$[A_{1-x}(B_{1-q}B'_q)_x]_y Cu_z O_w \qquad (iii)$$

in which $0.1 \leq x < 1$
  $0 < q < 1$
  $y=2.0-4.0$, preferably 2.5–3.5
  $z=1.0-4.0$, preferably 1.5–3.5
  $w=4.0-10.0$, preferably 6.0–8.0
  A is a rare earth element and
  B and B' are different alkaline earth elements.

A further sub-species can be represented by the general formula $$[(A_{1-p}A'_p)_{1-x}(B_{1-q}B'_q)_x]_y Cu_z O_w \qquad (iv)$$

in which $0.1 \leq x < 1$
  $0 < p < 1$
  $0 < q < 1$
  $y=2.0-4.0$, preferably 2.5–3.5
  $z=1.0-4.0$, preferably 1.5–3.5
  $w=4.0-10.0$, preferably 6.0–8.0
  A and A' are different rare earth elements and
  B and B' are different alkaline earth elements.

Yet another sub-species can be represented by the general formula $$[(A_{1-p}A'_p)_{1-x}B_x]_y Cu_z O_w \qquad (v)$$

in which
  $0.1 \leq x < 1$
  $0 < p < 1$
  $y=2.0-4.0$, preferably 2.5–3.5
  $z=1.0-4.0$, preferably 1.5–3.5
  $w=4.0-10.0$, preferably 6.0–8.0
  A and A' are different rare earth elements and
  B is an alkaline earth element. Examples of materials of the general formula (v) are $Y_{0.5}Gd_{0.5}Ba_2Cu_3O_{6-8}$ and $Y_{0.5}Yb_{0.5}Ba_2Cu_3O_{6-8}$.

DETAILED DESCRIPTION OF THE PREFERRED EMBODIMENTS

Figure 1:
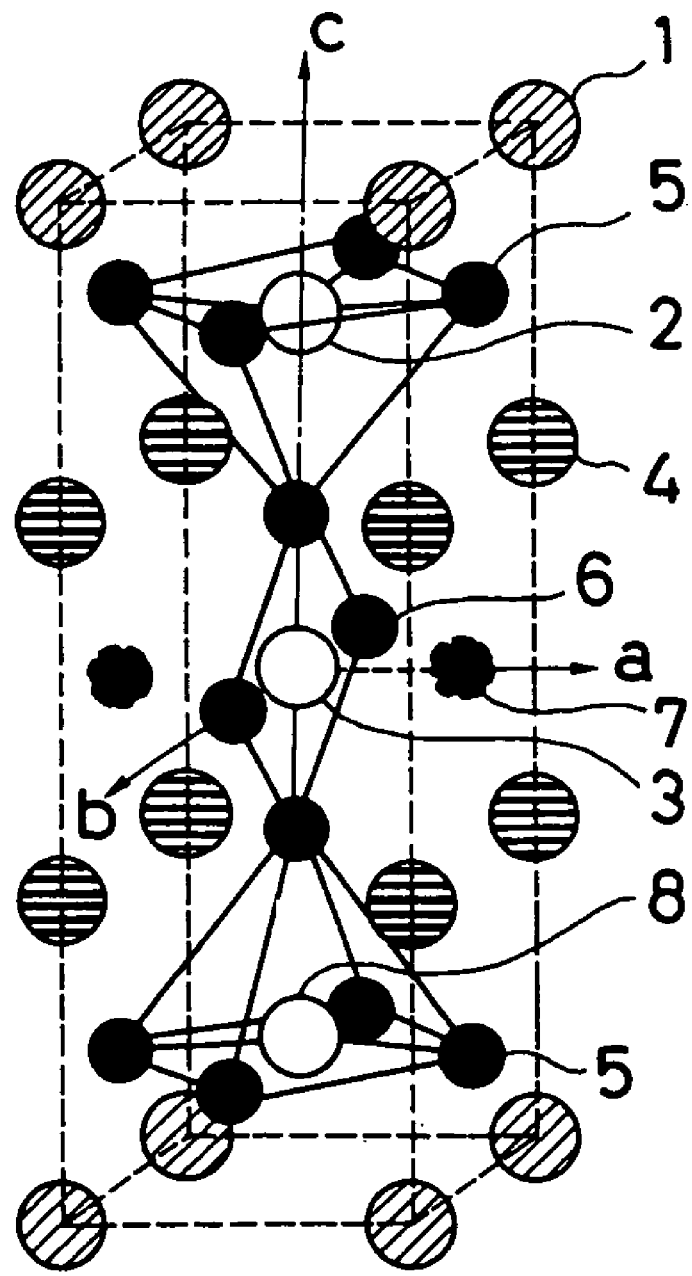
FIG. 1 is a perspective view showing a perovskite-like structure superconducting ceramic.

In the above general formulae except where otherwise specified or where the context does not permit each of A, A', B and B' is used collectively, that is to say A may represent any number of rare earth elements $A_1, A_2, A_3 \ldots A_n$, and so on.

The term "rare earth elements" used herein should be given the same meaning as that in "Chambers Dictionary of Science and Technology", that is, the lanthanide elements of atomic numbers 57 to 71, together with scandium (atomic no. 21) and yttrium (atomic no. 39), namely, La, Ce, Pr, Nd, Pm, Sm, Eu, Gd, Tb, Dy, Ho, Er, Tm, Yb, Lu, Sc and Y. The alkaline earth metals are those belonging to Group 2A of the Periodic Table, namely, Be, Mg, Ca, Sr, Ba and Ra.

Superconducting materials have a pervoskite-like structure a unit cell of which is illustrated schematically in FIG. 1 of the accompanying drawings. In the figure, copper atoms 2 and 8 are each surrounded by five oxygen atoms 5 in a pyramidal arrangement; between the two pyramids, a central copper atom 3 is surrounded by four oxygen atoms (two of which form the apices of the oxygen pyramids around the copper atoms 2 and 8) and two vacant positions 7. The atoms of rare earth elements 1 are situated at the corners of the unit cell and the atoms of alkaline earth metals 4 are situated along the edges of the unit cell. The structure shown in the figure may be considered to represent $(YB_2)Cu_3O_{7-x}$. In this structure, superconductivity results from the electrons in the layer-like structure which is formed by the four oxygen atoms surrounding each central copper atom 3.

The superconducting ceramics in accordance with the invention, in common with prior art superconducting ceramics, have such a perovskite-like structure. However, two or more rare earth elements and/or two or more alkaline earth elements are used, so that poly-crystalline structures are formed together forming a number of large crystalline particles. In this manner, Tc is elevated because of the reduced area of the interfaces between crystalline particles. Of course, the ideal structure is a single-crystal.

Superconducting ceramics can be very easily produced. For example, firstly, in accordance with the prescribed stoichiometry oxides, and carbides if necessary, whose purity is 99.9% or 99.99%, are ground in a powder is pressed to a tablet and then finely ground and pressed to a tablet again. Finally, the tablet is sintered at an elevated temperature.

The following Examples illustrate the invention. Although the Examples do not include all the combinations of elements which may be used to produce the materials of the invention, other combinations are also effective to constitute improved superconducting materials.

EXAMPLE 1

$Y_2O_3$, $BaCO_3$, $CaCO_3$ and CuO all in the form of fine powders having a purity of 99.95% or higher were mixed in the proportions required by formula (ii) with x=0.67 (A:B=1:2); x'=0.67 (A:B'=1:2); y=3.0; y'=3.0; z=3.0; z'=3.0; w=6 to 8; and w'=6 to 8 with a being yttrium, B being barium and B' being calcium (B:B'=1:1).

These materials were thoroughly mixed in a mortar, packed into capsules and pressed in the form of tablets of 10 mm diameter and 3 m thickness. Then, the tablets were baked for 8 hours at 500–900° C., for example 700° C., in oxidizing surroundings, for example ambient air.

The tablets were then ground in a mortar to a powder with an average particle radius of less than 10 μm. The powder was pressed again in capsules under a pressure of 50 kg/cm² at an elevated temperature to form tablets. The tablets were baked for 10–50 hours, for example 15 hours, at 500–900° C., for example 900° C. in oxidizing surroundings, for example ambient air. Finally, the tablets were reduced by heating for 3–30 hours, for example 20 hours at 600–1100° C., for example 800° C. in an oxygen/argon mixture containing a minor proportion of oxygen. Eventually, a new structure was observed. This material can be represented by the stoichiometric formula $YBaCaCu_3O_{6-8}$.

The relationship between the temperature and the resistivity of this material in tablet form was investigated. It was observed that the phase transition to the superconducting state began as the temperature descended below 104° K.(Tc onset temperature) and the disappearance of resistance was observed at 93° K.(Tco).

EXAMPLE 2

$Yb_2O_3$, $BaCO_3$, $Sr_2O_3$ and CuO all in the form of fine powders having a purity of 99.95% or higher were mixed in the proportions required by formula (ii) with x=0.67 (A:B=1:2); x'=0.67 (A:B'=1:2); y=3.0; y'=3.0; z=3.0; z'=3.0; w=6 to 8; and w'=6 to 8 with A being ytterbium, B being barium and B' being strontium (B:B'=1:1).

The procedure described in example 1 was followed and the resulting material can be represented by the stoichiometric formula $YbBaSrCu_3O_{6-8}$.

The relationship between the temperature and the resistivity of this material in tablet form was investigated. The phase transition to superconductivity was observed when the temperature descended below 109° K.(Tc onset temperature) and the disappearance of resistance was observed at 37° K.(Tco)

EXAMPLE 3

The procedure of Example 2 was repeated but with 30% of Ba and Sr substituted by Ca (introduced as $CaCO_3$). As a result, Tc onset was elevated further by 3–5° K. The material obtained can be represented by the stoichiometric formula $YbBa_{0.7}Sr_{0.7}Ca_{0.6}Cu_3O_{6-8}$.

EXAMPLE 4

$Y_2O_3$, $Yb_2O_3$, $BaCO_3$, $CaCO_3$ and CuO all in the form of fine powders having a purity of 99.95% or higher were mixed in the proportions required by formula (ii) with x=0.67 (A:B=1:2); x'=0.67 (A:B=1:2); y=3.0; y'=3.0; z=3.0; z'=3.0; w=6 to 8; and w'=6 to 8 with A being yttrium, A' being ytterbium, B being barium and B' being calcium (B:B'=1:1; A:A'=1:1, 1:2 or 1:5).

These materials were thoroughly mixed in a mortar, packed into capsules and pressed (3 kg/cm²) in the form of tablets of 10 mm diameter and 5 m thickness. Then, the tablets were baked for 8 hours at 500–1000° C., for example 700° C. in oxidizing surroundings, for example ambient air.

The tablets were then ground in a mortar to a powder with an average particle radius of less than 10 μm. The powder was pressed again in capsules under a pressure of 50 kg/cm² at 300–800° C. to form tablets. The tablets were baked for 10–50 hours, for example 15 hours at 500–900° C., for example 900° C. in oxidizing surroundings, for example in ambient air. In addition to the conventional perovskite-like structure, a different structure was also observed in this tablet. Finally, the tablets were reduced by heating for 3–30 hours, for example 20 hours at 600–1100° C., for example 800° C. in an oxygen/argon mixture containing a minor proportion of oxygen. Eventually, a new structure was clearly observed. This material can be represented by the stoichiometric formula $Y_{0.5}Yb_{0.5}BaCaCu_3O_{6-8}$.

The relationship between the temperature and the resistivity of this material in tablet form was investigated. Phase transition to superconductivity was observed when the temperature descended below 107° K. and the disappearance of resistance was observed at 101° K.(Tco).

EXAMPLE 5

The procedure of Example 4 was repeated but using in place of ytterbium and barium, gadolinium (as $Gd_2O_3$) and strontium and x:x'=1:1 and y:y'=1:1. To onset and Tco were observed at 104° K. and at 84° K., respectively. This material can be represented by the stoichiometric formula $Y_{0.5}Yb_{0.5}BaSrCu_3O_{6-8}$.

EXAMPLE 6

The procedure of Example 4 was repeated but with 30% of Y and Yb substituted by Nd (introduced as $Nd_2O_3$). Tc onset was elevated further by 3–5° K.

EXAMPLE 7

$Yb_2O_3$, $Y_2O_3$, $BaCO_3$, $Sr_2O_3$ and CuO all in the form of fine powders having a purity of 99.95% or higher were mixed in the proportions required by formula (i) with x=0.67 (A:B=1:2); y=3.0; z=3.0; and w=6 to 8 with A being yttrium and ytterbium, and B being barium (Y:Yb being 1:1, 1:2 or 1:5).

These materials were thoroughly mixed in a mortar, packed into capsules and pressed (3 kg/cm²) in the form of tablets of 10 mm diameter and 3 mm thickness. Then, the tablets were baked for 8 hours at 500–1000° C., for example 700° C. in oxidizing surroundings, for example ambient air.

The tablets were then ground in a mortar to a powder with an average particle radius of less than 10 μm. The powder was pressed again in capsules under a pressure of 50 kg/cm² at 300–500° C., for example 400° C. to form tablets. The elevation of temperature is advantageous in reducing defects in the tablets. Then, the tablets were baked and oxidized for 10–50 hours, for example 15 hours at 500–1000° C., for example 900° C. in oxidizing surroundings, for example ambient air. Finally, the tablets were reduced by heating for 3–30 hours, for example 20 hours at 600–1100° C., for example 800° C. in an oxygen/argon mixture containing a minor proportion of oxygen. Eventually, a new structure was observed clearly. This material can be represented by the stoichiometric formula $Y_{0.5}Yb_{0.5}Ba_2Cu_3O_{6-8}$.

The relationship between the temperature and the resistivity of this material in tablet form was investigated. Phase transition to superconductivity was observed when the temperature descended below 105° K. (Tc onset temperature) and the disappearance of resistance was observed at 89° K. (Tco).

EXAMPLE 8

The procedure of Example 7 was repeated but using in place of ytterbium, gadolinium (as $Gd_2O_3$). Tc onset and Tco were observed at 95° K. and 88° K., respectively. This material can be represented by the stoichiometric formula $Y_{0.5}Gd_{0.5}Ba_2Cu_3O_{6-8}$.

EXAMPLE 9

The procedure of Example 7 was repeated but using 20–30% of Y and Yb substituted by Nd (introduced as $Nd_2O_3$). Tc onset was elevated further by 6–10° K.

The invention is not limited to the above exemplified materials and many modifications and variations may be used. For example, superconducting ceramics can be formed also in thin films by dissolving the powder of raw materials which have been baked, in a solvent, and applying to a substrate in the form of the solution. Then, the coated substrate can be baked in oxidizing surroundings, and finally baked in reducing surroundings.

The invention claimed is:

1. A superconducting ceramic of the general formula $0.5[(Yb_{1-x}B_x)_xCu_xO_w \cdot (Yb_{1-x}B'_{x'})_yCu_zO_{w'}]$, in which
$0.1 \leq x < 1$
$0.1 \leq x' < 1$
y=2.5–3.5,
y'=2.5–3.5,
z=1.5–3.5,
z'=1.5–3.5,
w=6.0–8.0,
w'=6.0–8.0,
wherein,
B is at least one alkaline earth element and includes Ba and
B' is at least one alkaline earth element and includes Sr.

2. A superconducting ceramic of the general formula $0.5[(Yb_{1-x}B_x)_yCu_zO_w \cdot (Yb_{1-x}B'_{x'})_yCu_zO_{w'}]$, in which
$0.1 \leq x < 1$
$0.1 \leq x' < 1$
y=2.5–3.5,
y'=2.5–3.5,
y=1.5–3.5,
z'–1.5–3.5,
w=6.0–8.0,
w'=6.0–8.0,
wherein,
B is at least one alkaline earth element and includes Ba and
B' is at least one alkaline earth element and includes Sr and Ca.

3. A superconducting ceramic of the general formula $0.5[(Y_{1-x}Yb_{1-x}B_x)_yCu_zO_w \cdot (Yb_{1-x}B'_{x'})_yCu_zO_{w'}]$, in which
$0.1 \leq x < 1$
$0.1 \leq x' < 1$
y=2.5–3.5,
y'=2.5–3.5,
z=1.5–3.5,
z'=1.5–3.5, w=6.0–8.0,
w'=6.0–8.0,
wherein,
B is at least one alkaline earth element and includes Ba and
B' is at least one alkaline earth element and includes Sr.

4. A superconducting ceramic of the general formula $0.5[(Y_{1-x}Yb_{1-x}B_x)_yCu_zO_w(Y_{1-x'}Yb_{1-x'}B'_{x'})_{y'}Cu_{z'}O_{w'}]$, in which $0.1 \leq x < 1$
$0.1 \leq x' < 1$
y=2.5–3.5,
y'=2.5–3.5,
z=1.5–3.5,
z'=1.5–3.5,
w=6.8–8.0,
w'=6.0–8.0,
wherein,
B is at least one alkaline earth element and includes Ba and
B' is at least one alkaline earth element and includes Ca.

5. A superconducting ceramic having the stoichiometric formula $YbBaSrCu_3O_{6-8}$.

6. A superconducting ceramic having the stoichiometric formula $YbBa_{0.7}Sr_{0.7}Ca_{0.6}Cu_3O_{6-8}$.

7. A superconducting ceramic having the stoichiometric formula $Y_{0.5}Yb_{0.5}BaSrCu_3O_{6-8}$.

8. A superconducting ceramic having the stoichiometric formula $Y_{0.5}Yb_{0.5}BaCaCu_3O_{6-8}$.

* * * * *